(12) United States Patent
Jozaki (10) Patent No.: US 6,204,193 B1
(45) Date of Patent: Mar. 20, 2001

(54) METHOD FOR ETCHING

(75) Inventor: Tomohide Jozaki, Kagoshima (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/291,017

(22) Filed: Apr. 14, 1999

(30) Foreign Application Priority Data

Apr. 23, 1998 (JP) .................................................. 10-113566

(51) Int. Cl.[7] .................................................. H01L 21/302
(52) U.S. Cl. ........................... 438/723; 438/724; 438/738
(58) Field of Search .................................... 438/689–692, 438/697, 714, 723, 724, 733, 738, 743

(56) References Cited

U.S. PATENT DOCUMENTS

| | | | |
|---|---|---|---|
| 5,246,883 | * 9/1993 | Lin et al. ............................... | 437/195 |
| 5,793,496 | * 7/1998 | Flanner et al. ........................ | 438/743 |
| 5,869,403 | * 2/1999 | Becker et al. ........................ | 438/738 |
| 5,891,799 | * 4/1999 | Tsui ....................................... | 438/624 |
| 6,025,255 | * 2/2000 | Chen et al. ............................ | 428/595 |

* cited by examiner

Primary Examiner—Benjamin L. Utech
Assistant Examiner—Kin-Chan Chen
(74) Attorney, Agent, or Firm—Sonneschein, Nath & Rosenthal (57) ABSTRACT

A method for etching a laminated film comprising at least two layers of a semiconductor device, the method comprising: a step, in which etching of an upper layer is started with a first etching gas, and the etching of the upper layer is stopped before a lower layer is exposed; and a step, in which a remainder of the upper layer and the lower layer is etched with a second etching gas.

1 Claim, 9 Drawing Sheets

SWITCHING FROM $C_4F_8$ TO $CHF_3$

SWITCHING FROM
$C_4F_8$ TO $CHF_3$

METHOD FOR ETCHING

RELATED APPLICATION DATA

The present application claims priority to Japanese Application No. P10-113566 filed Apr. 23, 1998 which application is incorporated herein by reference to the extent permitted by law.

FIELD OF THE INVENTION

The present invention relates to a method for etching applied to a fine processing represented by a semiconductor and an electronic device part.

BACKGROUND OF THE INVENTION

In a semiconductor device used in a VLSI of recent years, a severe demand in fine processing rises according to development of its high integration and high performance. Taking the structure of a DRAM as an example, the width of wiring is reduced with the distance of wiring being reduced, and the hole diameter of a contact hole also becomes small. As a result, the distance between the wiring and the contact hole becomes small, and there arises a fear of electric short circuit. In order to prevent the same, a layer of silicon nitride is inserted in addition to an interlayer insulating film formed with an oxide film.

Figure 1:
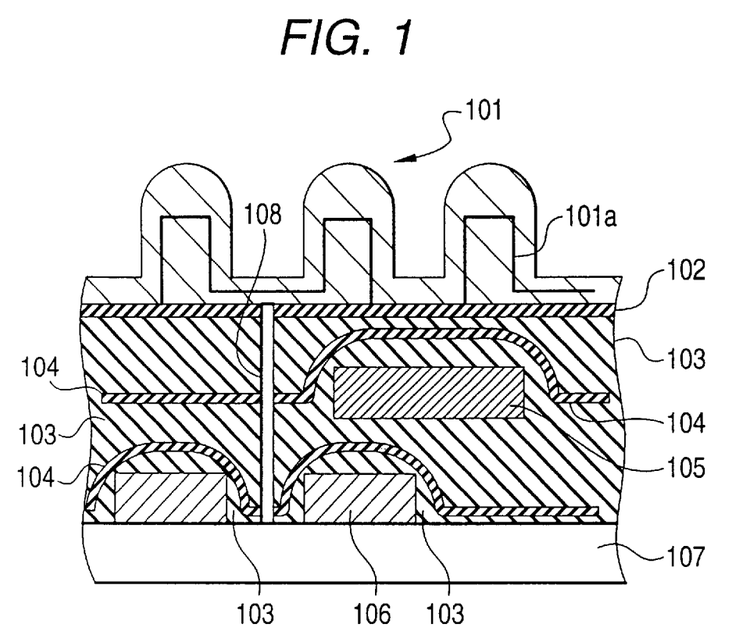
FIG. 1 is a schematic cross sectional view of a DRAM of a COB structure for describing problems associated with the conventional etching method.

FIG. 1 is a schematic cross sectional view of a DRAM of a COB structure for describing the problems of the conventional dry etching method.

A bit line 106 is formed on a silicon substrate 107, and an oxide film 103 is formed on the bit line 106. A silicon nitride film 104 is formed on the oxide film 103, and an oxide film 103 is formed on the silicon nitride film 104. A word line 105 is formed inside the oxide film 103. A silicon nitride film 104 is formed on the oxide film 103, and an oxide film 103 is formed on the silicon nitride film 104. A silicon nitride film 102 is formed on the oxide film 103, and a capacitor part 101 is formed on the silicon nitride film 102. A contact hole 108 is opened from the capacitor part 101 to a transistor at the lower part of the figure.

In order to produce the contact hole 108, a laminated film composed of the oxide film 103 and the silicon nitride films 102 and 104 should be etched as shown in FIG. 1.

As an etching gas that can etch both the oxide film and the silicon nitride film, a $CHF_3$ series gas can be exemplified. As an example of fine processing technique in recent years, processing of a contact hole using a polymask instead of a resist mask is being employed. Submicron processing, which has not been accomplished by the resist mask, can be realized by using the polymask.

However, when a contact hole is produced with the polymask by using the $CHF_3$ series gas singly, there arises a phenomenon in that the selective ratio of the mask and the oxide film to shift the mask.

Furthermore, the conventional etching method involves the following problems.

Figure 2:
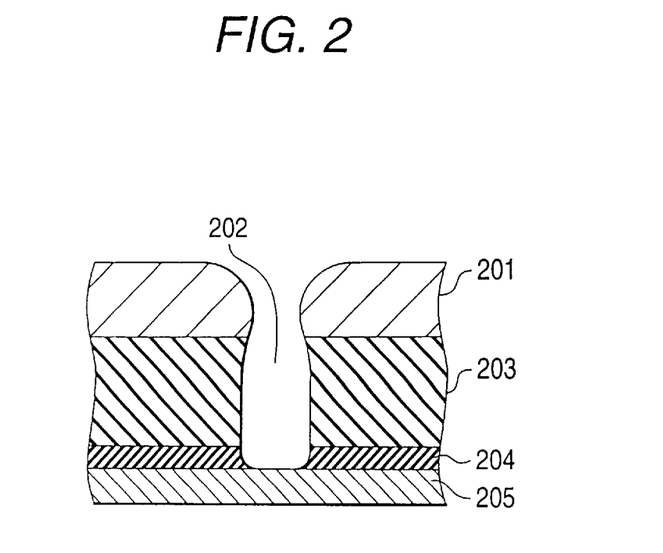
FIG. 2 is a schematic cross sectional view showing a bowing shape of a contact hole when an interlayer film is etched by the conventional etching method.
Figure 3:
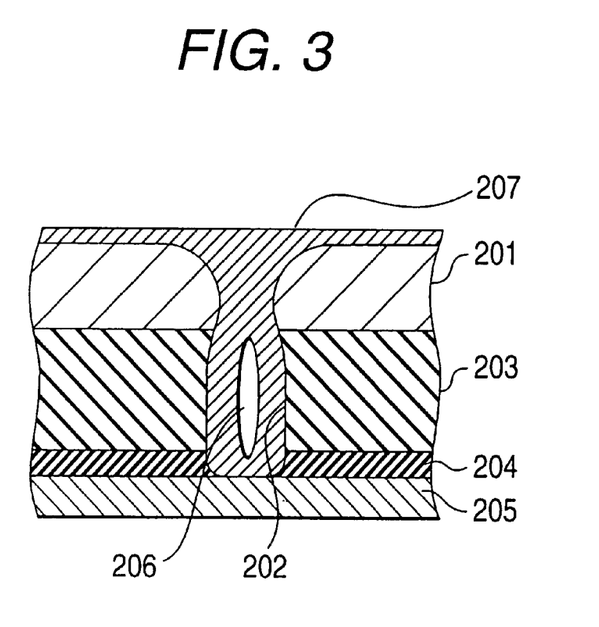
FIG. 3 is a schematic cross sectional view showing a formation of a hollow space inside the contact hole when a filler is buried in the contact hole shown in FIG. 2.
Figure 4:
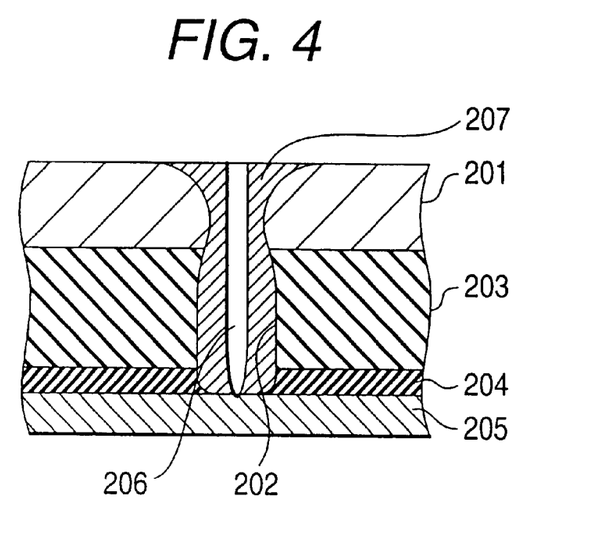
FIG. 4 is a schematic cross sectional view showing the state, in which a silicon substrate at the bottom of the contact hole is etched when the filler shown in FIG. 3 is subjected to etch back.

FIGS. 2 to 4 are schematic cross sectional views showing a part of a production process of a semiconductor device using the conventional etching method, and also describing the problems associated with the conventional etching method.

As shown in FIG. 2, a silicon nitride film 204 is formed on a silicon substrate 205, and an oxide film 203 is formed on the silicon nitride film 204. An etching mask (poly-Si) 201 is formed on the oxide film 203. When a contact hole 202 is formed in the oxide film 203 and the silicon nitride film 204 by etching with the etching mask 201 as a mask by using a $CHF_3$ series gas singly, the shape of the contact hole becomes a bowing shape.

Thereafter, a hole filler 207, such as poly-Si, is accumulated on the poly-Si (etching mask) 201 to bury the contact hole 202 as shown in FIG. 3. A hollow space 206 is formed inside the contact hole 202 since the contact hole 202 has the bowing shape.

The hole filler 207 is then subjected to etch back. The hollow part 206 is etched at a faster rate than the other part as shown in FIG. 4, and there arises a problem in that the silicon substrate 205 at the bottom of the contact hole 202 is etched, which is not planned to be etched.

As a method for preventing such a problem, a method is considered in that after etching the oxide film 203 with a $C_4F_8$ series gas, the silicon nitride film 204 is etched with a $CHF_3$ series gas. The oxide film is easily etched with the $C_4F_8$ series gas, but the silicon nitride film is not easily etched by that gas. In order to practice such a method, after etching the oxide film 203 with the $C_4F_8$ series gas, a fluorocarbon series reaction product deposited inside the contact hole must be removed with an $O_2$ plasma (ashing), and then further cleaned with sulfuric acid and aqueous hydrogen peroxide, followed by etching the silicon nitride film 204 by using the $CHF_3$ series gas. In the case where the multi-layer film comprising plural oxide films and silicon nitride films is produced as shown in FIG. 1, such a method requires the removing step of the reaction product and cleaning step for each films, to increase the cost.

Figure 5:
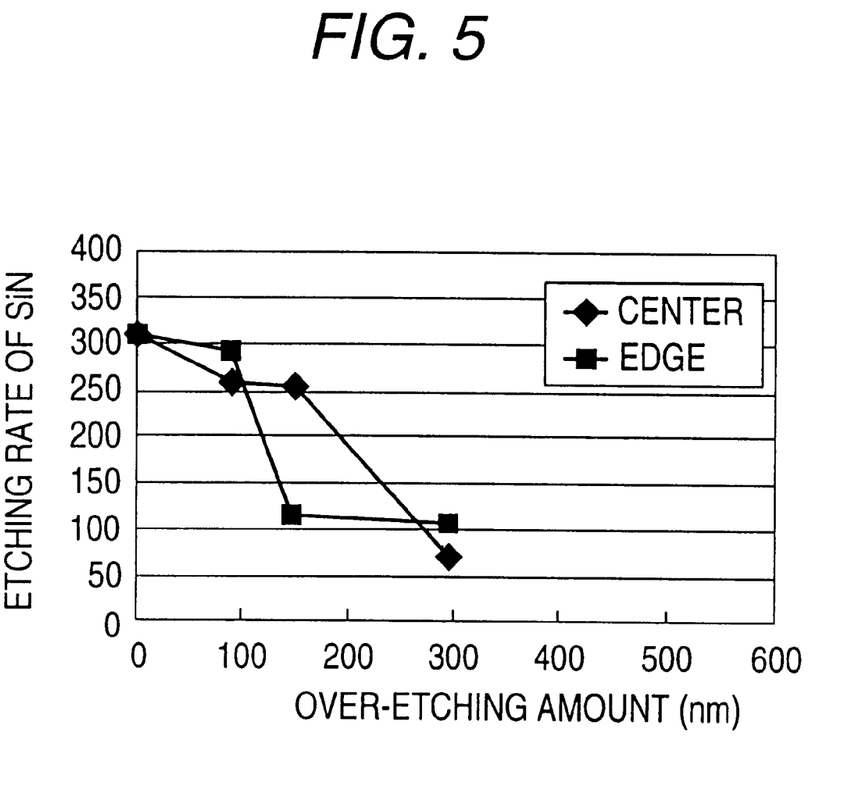
FIG. 5 is a graph showing the relationship between the over-etching amount of an oxide film and the etching rate of a silicon nitride (SiN) film when a laminated film comprising the oxide film and the silicon nitride film is etched.

In order to suppress the cost, on the other hand, a method is considered in that the removing step of the reaction product and the cleaning step are omitted, and after etching the oxide film 203 with a $C_4F_8$ series gas, the etching gas is switched from the $C_4F_8$ series gas to a $CHF_3$ gas, to continuously etch the silicon nitride film 204. However, as shown in FIG. 5, the etching rate (etching amount) of the silicon nitride film under the oxide film is decreased in proportion to the over-etching amount of the oxide film with the $C_4F_8$ series gas, and when the over-etching amount reaches a specific value, an etching stop phenomenon occurs. Therefore, the removing step of the reaction product and the cleaning step cannot be omitted.

Figure 6A:
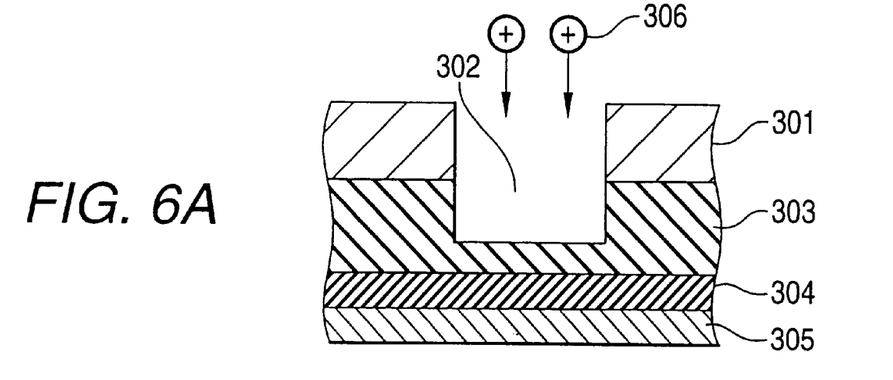
FIGS. 6A, 6B, and 6C are schematic cross sectional views for demonstrating the phenomenon in that when etching of an oxide film is conducted by using a $C_4F_8$ series gas and then etching of a silicon nitride film is continuously conducted by using a $CHF_3$ series gas, the etching rate of the silicon nitride film under the oxide film with the $CHF_3$ series gas is decreased in proportion to the over-etching amount of the oxide film with the $C_4F_8$ series gas, and when the over-etching amount is further increased, an etching stop phenomenon of silicon nitride film occurs.
Figure 6B:
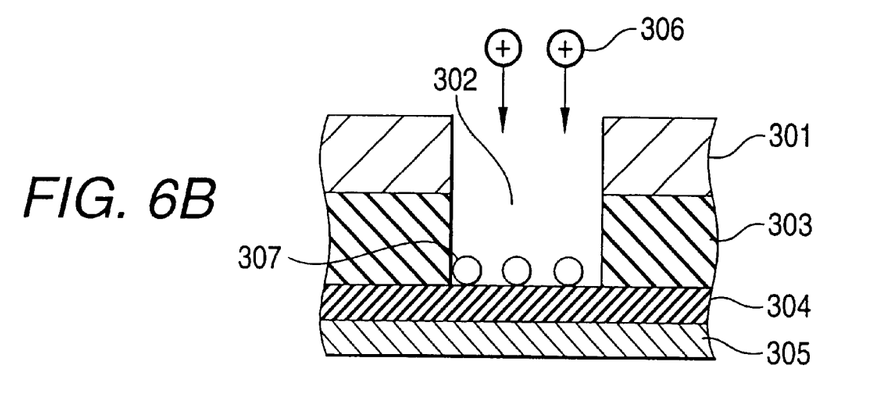
Figure 6C:
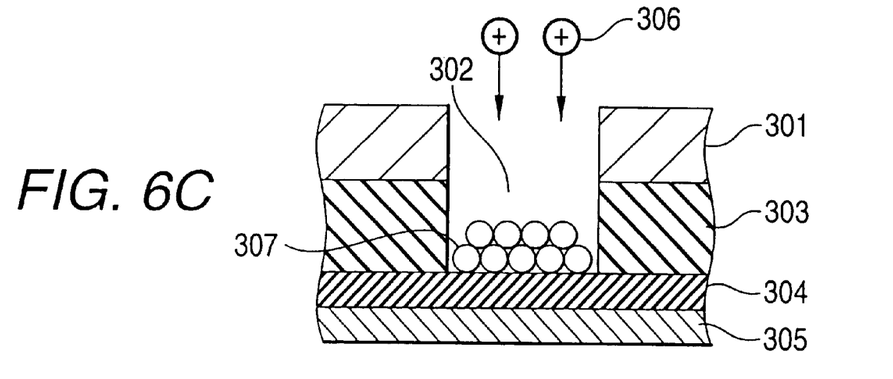

FIGS. 6A, 6B, and 6C are schematic cross sectional view in FIG. 5 showing the phenomenon in that etching stop occurs when the over-etching amount of the oxide film is increased.

As shown in FIG. 6A, a silicon nitride film 304 is formed on a silicon substrate 305, and an oxide film 303 is formed on the silicon nitride film 304. An etching mask 301 is formed on the oxide film 303. The oxide film 303 is then etched with the etching mask 301 as a mask by using a $C_4F_8$ series gas 306 to immediately before exposing the surface of the silicon nitride film 304. In this case, no reaction product is formed inside a contact hole 302.

As shown in FIG. 6B, a silicon nitride film 304 is formed on a silicon substrate 305, and an oxide film 303 is formed on the silicon nitride film 304. An etching mask 301 is formed on the oxide film 303. The oxide film 303 is then etched with the etching mask 301 as a mask by using a $C_4F_8$ series gas 306 to immediately before exposing the surface of the silicon nitride film 304. In this case, a fluorocarbon series reaction product 307 is formed inside a contact hole 302.

As shown in FIG. 6C, a silicon nitride film 304 is formed on a silicon substrate 305, and an oxide film 303 is formed on the silicon nitride film 304. An etching mask 301 is formed on the oxide film 303. The oxide film 303 is then over-etched with the etching mask 301 as a mask by using a $C_4F_8$ series gas 306. In this case, the amount of a fluorocarbon series reaction product 307 formed inside a contact hole 302 is larger than the case of FIG. 6B.

It is understood from these figures that when the oxide film 303 is etched with a $C_4F_8$ series gas, the fluorocarbon series reaction product 307 starts to be accumulated inside the contact hole 302 on exposing the silicon nitride film 304 as an underlayer. The amount of the reaction product depends on the over-etching amount of the oxide film 303 with a $C_4F_8$ series gas as expected from FIG. 5. When the over-etching time is further prolonged, the etching effect of the ion is cancelled by the reaction product accumulated inside the contact hole, and the etching is stopped. Therefore, after etching the oxide film 303, the fluorocarbon series reaction product 307 is evaporated by ashing with oxygen in the form of COF as a reaction product of $O_2$ and CF, and then the silicon nitride film 304 is etched.

On the other hand, as a method of removing the reaction product inside the contact hole only by switching the gas conditions in the same etching apparatus, a method is considered in that after completing the etching of the oxide film 203 with a $C_4F_8$ series gas, oxygen is introduced into a chamber to remove the reaction product inside the hole. However, in the case where this method is employed, the reaction product attached to the inner wall of the chamber is also removed, which becomes a cause of formation of particles.

In the case where after completing the etching of the oxide film, the reaction product inside the hole is removed by generating an oxygen plasma in the chamber, the plasma invades the back surface of a wafer. At this time, if an electrostatic chuck is used as means for transferring the temperature of a lower electrode, the temperature of which is controlled as a cooling mechanism for the wafer, and a polyimide resin is used as a dielectric film, the polyimide film is also etched to bring about a severe trouble of insulation breakage.

SUMMARY OF THE INVENTION

The invention has been developed in view of the circumstances described above.

An object of the invention is to provide a method for etching in that even when the removing step of the reaction product and the cleaning step are omitted, a contact hole can be formed in an interlayer film obtained by laminating an upper layer and a lower layer.

In particular, an object of the invention is to provide a method for etching in that even when the removing step of the reaction product and the cleaning step are omitted, a contact hole can be formed in an interlayer film obtained by laminating an oxide film and a silicon nitride film.

The invention relates to a method for etching a laminated film comprising at least two layers of a semiconductor device, the method comprising: a step, in which etching of an upper layer is started with a first etching gas, and the etching of the upper layer is stopped before a lower layer is exposed; and a step, in which a remainder of the upper layer and the lower layer is etched with a second etching gas. It is preferred that the step using the first etching gas and the step using the second etching gas are continuously conducted in one chamber. It is also preferred that the laminated film comprises a silicon oxide film and a silicon nitride film. Furthermore, it is preferred that the first etching gas is a $C_4F_8$ series gas, and the second etching gas is a $CHF_3$ series gas.

In the method for etching according to the invention, because the etching of the upper layer is started by using the first etching gas, and the etching of the upper layer is stopped before the lower layer is exposed (i.e., the over-etching of the upper layer is not conducted), the reaction product formed by etching the lower layer with the first etching gas is not accumulated in the hole. Therefore, the removing step of the reaction product and the cleaning step need not conducted. Accordingly, on etching the remainder of the upper layer and the lower layer with the second etching gas, the etching can be continuously conducted only by switching from the first etching gas to the second etching gas.

The invention also relates to a process for producing a semiconductor device comprising etching a silicon nitride film and an oxide film formed thereon, the process comprising: a step, in which etching of the oxide film is started with a $C_4F_8$ series gas, and the etching with the $C_4F_8$ series gas is stopped before the silicon nitride film is exposed; and a step, in which a remainder of the oxide film and the silicon nitride film is etched with switching an etching gas from the $C_4F_8$ series gas to a $CHF_3$ series gas.

In the process for producing a semiconductor device according to the invention, because the etching of the oxide film is started by using the $C_4F_8$ series gas, and the etching of the oxide film is stopped before the silicon nitride film is exposed (i.e., the over-etching of the oxide film is not conducted), the reaction product is not accumulated in the hole. Therefore, the removing step of the reaction product and the cleaning step need not conducted. Accordingly, on etching the remainder of the oxide film and the silicon nitride film with the $CHF_3$ series gas, the etching can be continuously conducted only by switching from the $C_4F_8$ series gas to the $CHF_3$ series gas.

DESCRIPTION OF PREFERRED EMBODIMENTS

An embodiment of the invention will be described with reference to the drawings.

Figure 7A:
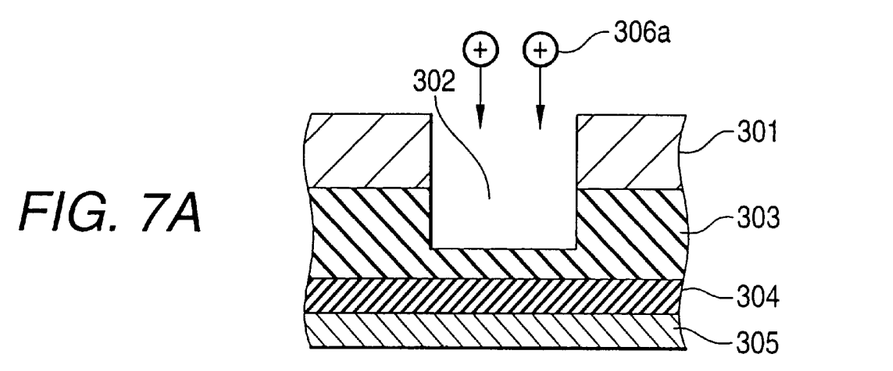
FIGS. 7A and 7B are schematic cross sectional views showing an embodiment of the method for etching according to the invention.
Figure 7B:
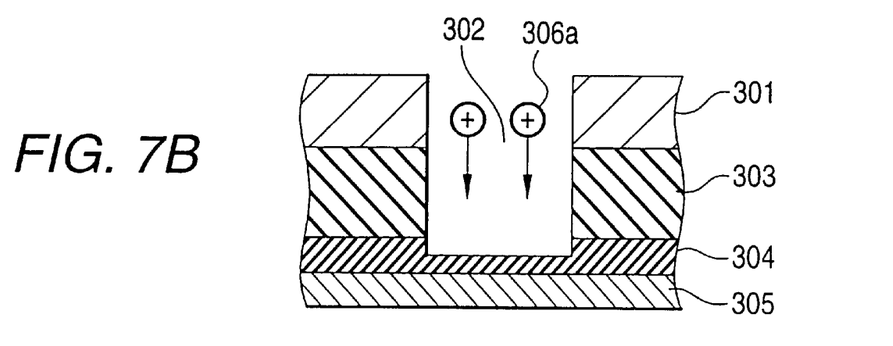

FIGS. 7A and 7B are schematic cross sectional views showing an embodiment of the method for etching of a semiconductor device according to the invention.

As a result of earnest investigation made by the inventors in view of the problems described above, a method has been found in that the etching for forming a contact hole in a multilayer insulating material composed of an oxide film and a silicon nitride film can be continuously conducted without conducting a step of removing the reaction product by ashing with oxygen and a step of cleaning. The method is described in detail with reference to FIGS. 7A and 7B.

As shown in FIG. 7A, a silicon nitride film 304 is formed on a silicon substrate 305, and an oxide film ($SiO_2$ film) 303 is formed on the silicon nitride film 304. An etching mask 301 is formed on the oxide film 303. Etching of the oxide film 303 is started with the etching mask 301 as a mask by using a $C_4F_8$ series gas 306a, and the etching of the oxide film with the $C_4F_8$ series gas is stopped before the silicon nitride film 304 under the oxide film 303 is exposed. The timing of stopping the etching is determined by an etching end point monitor or the etching rate.

Thereafter, as shown in FIG. 7B, the etching gas is switched from the $C_4F_8$ series gas 306a to a $CHF_3$ series gas 306b, and the remainder of the oxide film 303 and the silicon nitride film 304 as the underlayer are etched. Accordingly, in the process of forming a contact hole in a laminated film composed of the oxide film and the silicon nitride film, the etching can be continuously conducted only by switching the etching gas from the $C_4F_8$ series gas to the $CHF_3$ series gas without conducting an ashing step and a cleaning step during the process. In general, when the $C_4F_8$ series gas is used as an etching gas, etching of the oxide film can be easily conducted, but etching of the silicon nitride film is extremely difficult. When the $CHF_3$ series gas is used as an etching gas, both etching of the oxide film and etching of the silicon nitride film are easily conducted.

According to the embodiment described above, because the etching of the oxide film 303 is started with the $C_4F_8$ series gas, and the etching is stopped before the silicon nitride film 304 is exposed (because over-etching of the oxide film 303 is not conducted), no fluorocarbon series reaction product accumulates in the contact hole 302. The remainder of the oxide film 303 and the silicon oxide film 304 are etched by using the $CHF_3$ series gas 306b. Therefore, the laminated film composed of the oxide film and the silicon nitride film can be continuously etched by switching the etching gas from the $C_4F_8$ series gas to the $CHF_3$ series gas.

The invention can be applied to the case where a contact hole is processed by using a resist mask or a polymask, the case where a hole having an ellipsoidal shape other than a contact hole is processed, and the case where processing is conducted for a pattern in which various oxide films and a silicon nitride film are laminated.

The thickness of the remainder of the oxide film 303 at the time of stopping the etching of the oxide film with the $C_4F_8$ series gas before the silicon nitride film 304 under the oxide film 303 is exposed is preferably about from 70 to 30 nm.

EXAMPLE

Examples of the invention will be described in detail with reference to the drawings.

FIGS. 8 to 11 are schematic views showing plasma processing apparatus that can generate a high density plasma, used in explaining the method for etching according to the examples of the invention described hereinafter.

Figure 8:
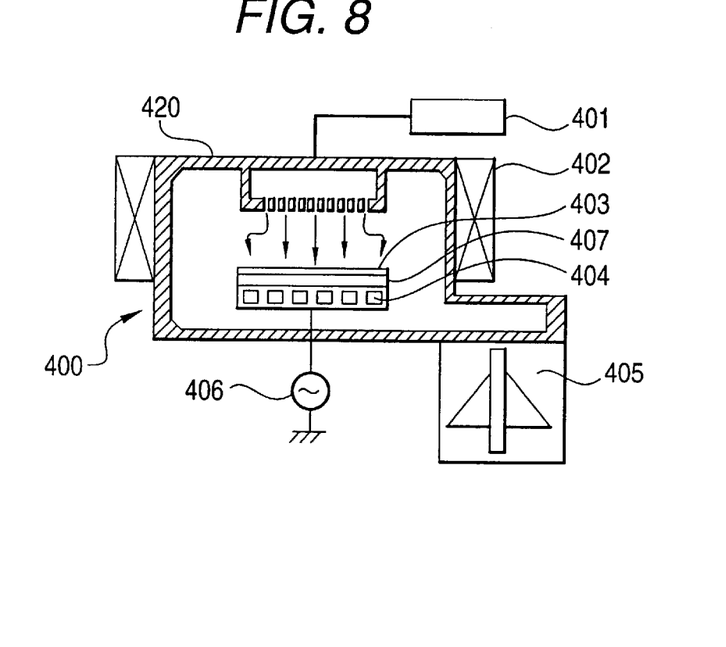
FIG. 8 is a schematic view showing a plasma etching apparatus of a dipole ring type.

FIG. 8 is a schematic view showing a plasma etching apparatus of a dipole ring type. The plasma etching apparatus 400 has a chamber 420, and a dipole ring 402 comprising a permanent magnet in the form of a pole is provided on the side of the chamber 420. A wafer 403 held by an electrostatic chuck 407 or a clamp (not shown in the figure) is placed in the chamber 420, magnetic lines of force from the dipole ring 402 are generated in parallel the plane of the wafer. A high density plasma excited at the maximum can be easily formed in the chamber 420 by the magnetic field. The distribution of the magnetic lines of force on the surface of the wafer is not uniform with respect to the plane, and the density of the magnetic flux changes on the wafer to compensate the biased plasma distribution due to the magnetic field.

Gas supplying means 401 for supplying a gas into the chamber is connected to an upper part of the chamber 420. A lower electrode 404 is arranged under the electrostatic chuck 407, and a high frequency power source 406 is connected to the lower electrode 404. Evacuation means 405 is connected to a lower part of the chamber 420.

Figure 9:
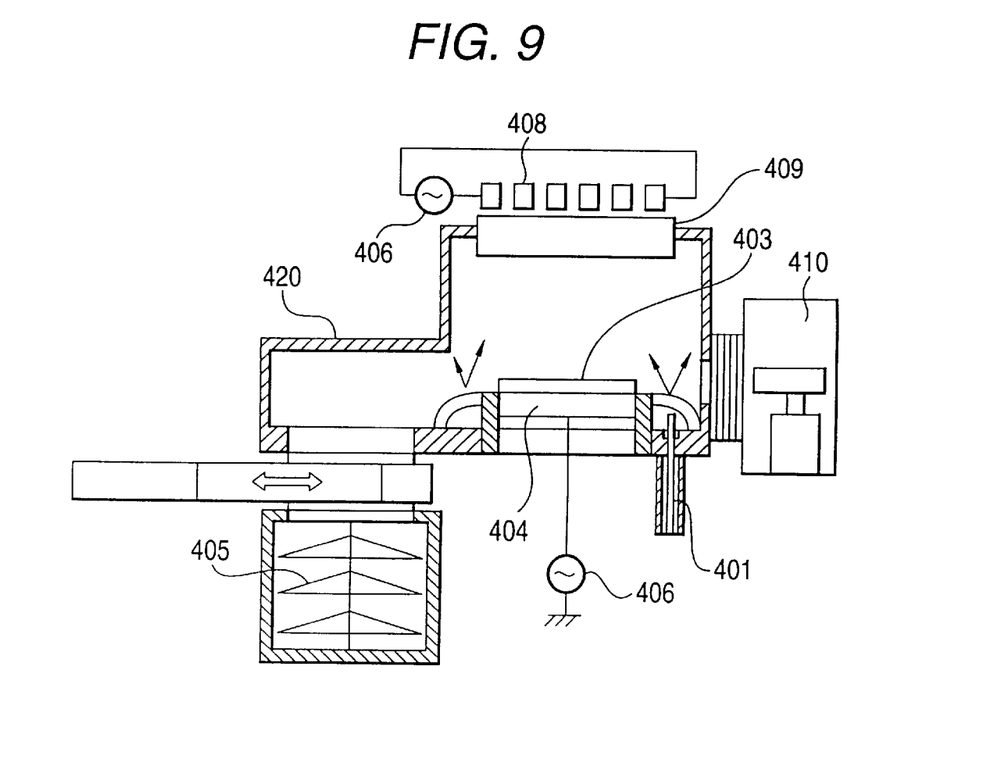
FIG. 9 is a schematic view showing a plasma etching apparatus of a TCP type.

FIG. 9 is a schematic view showing a plasma etching apparatus of a TCP type. The plasma etching apparatus 400 has a chamber 420, and a quartz ceiling plate 409 to be a dielectric plate is provided at an upper part of the chamber 420. A TCP electrode 408 wound in the form of a spiral to he a dielectric coupling coil is provided on the quartz ceiling plate 409, and a high frequency power source 406 is connected to the TCP electrode 408. An RF wave of 13.56 MHz is applied from the high frequency power source 406 to the TCP electrode 408, and a high density plasma is generated.

A lower electrode 404 is arranged inside the chamber 420, and a high frequency power source 406 is connected to the lower electrode 404. A wafer 403 is placed on the lower electrode 404. Transferring means 410 is equipped on the side of the chamber 420. Gas supplying means 401 and evacuation means 405 are connected to a lower part of the chamber 420.

Figure 10:
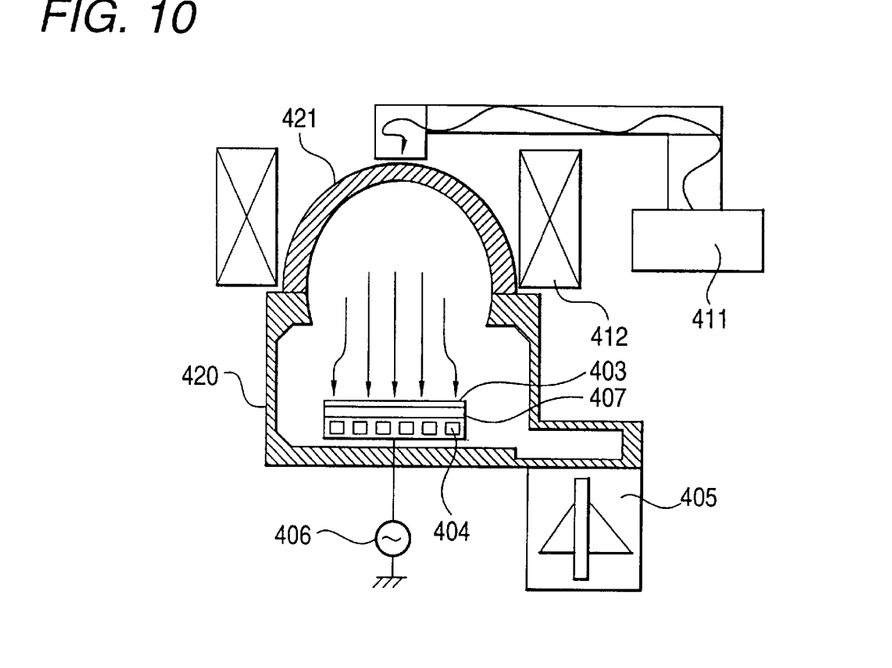
FIG. 10 is a schematic view showing an ECR plasma etching apparatus of an RF bias application type.

FIG. 10 is a schematic view showing an ECR plasma etching apparatus of an RF bias application type. The plasma etching apparatus 400 has a chamber 420, and a quartz belljar 421 in the form of a dome is provided on an upper part of the chamber 420. An electromagnet 412 in the form of a ring is provided on the side of the quartz belljar 421. Microwave generating means 411 is connected to an upper part of the quartz belljar 421 via a waveguide, and the microwave generating means 411 generates microwave with a magnetron.

A wafer 403 held by an electrostatic chuck 407 is placed inside the chamber 420, and a lower electrode 404 is provided under the electrostatic chuck 407. A high frequency power source 406 is connected to the lower electrode 404. Evacuation means 405 is connected to a lower part of the chamber 420.

The plasma etching apparatus has a constitution in that microwave generated by the microwave generating means 411 reaches the wafer 403 through the waveguide and the quartz belljar.

Figure 11:
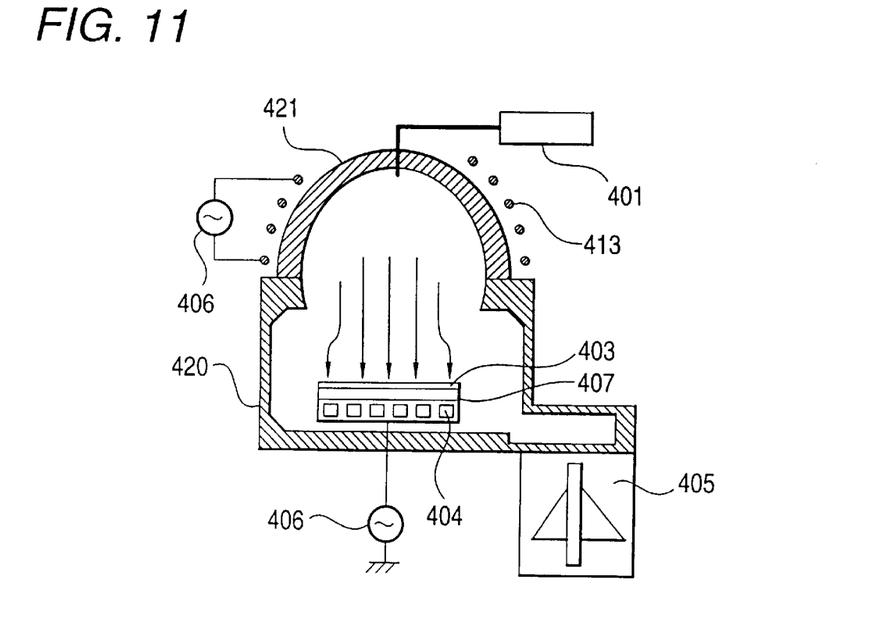
FIG. 11 is a schematic view showing an ICP plasma etching apparatus of a dome type.

FIG. 11 is a schematic view showing an ICP plasma etching apparatus of a dome type, in which the same symbols are attached to the same parts as in FIG. 10, and the parts different therefrom will be described.

Gas supplying means 401 for supplying a gas to a chamber 420 is connected to an upper part of a quartz belljar in the form of a dome 421. A coil 413 wound in the form of a spiral is provided on the quartz belljar in the form of a dome 421, and a high frequency power source 406 is connected to the coil 413. By applying from the high frequency power source 406, a plasma is packed inside the chamber 420 by the coil in the form of a dome, and thus a high density plasma can be easily generated. Furthermore, by applying a substrate bias of 450 KHz is applied from the high frequency power source 406 to the lower electrode 404, the independent control of the incident ion energy can be realized.

Figure 12:
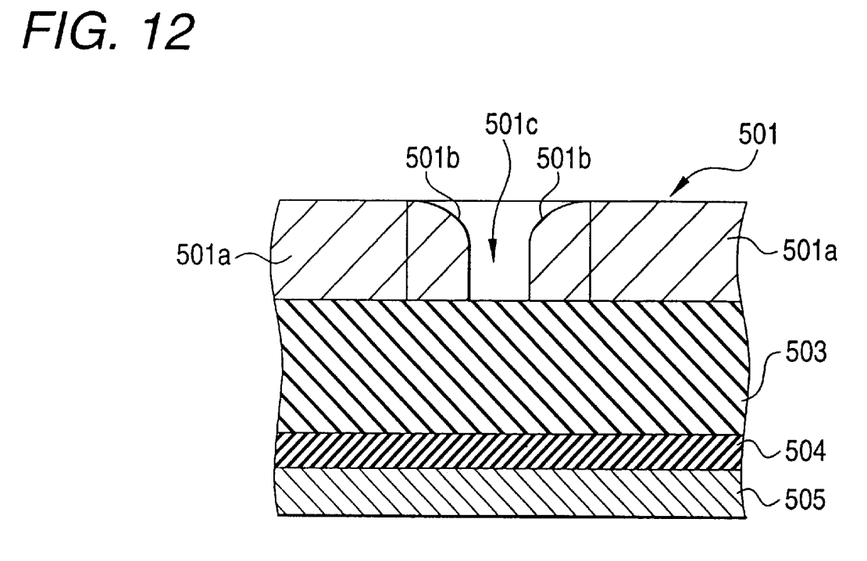
FIG. 12 is a schematic cross sectional view showing a sample for describing the method for etching in the first to fourth examples according to the invention.
Figure 13:
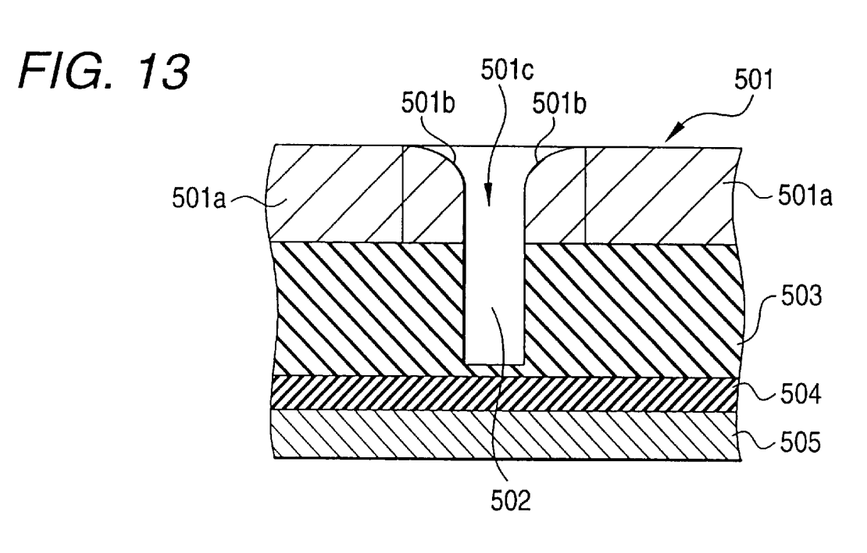
FIG. 13 is a schematic cross sectional view showing the method for etching in the first to fourth examples according to the invention in the step subsequent to the step shown in FIG. 12.
Figure 14:
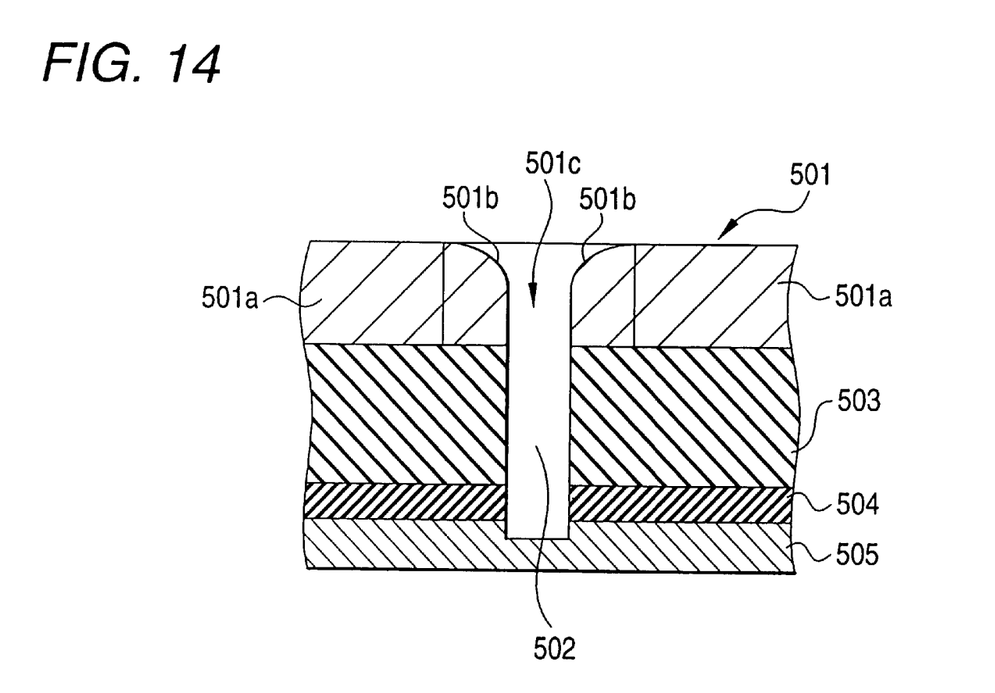
FIG. 14 is a schematic cross sectional view showing the method for etching in the first to fourth examples according to the invention in the step subsequent to the step shown in FIG. 13.

FIGS. 12 to 14 are schematic cross sectional views showing the method for etching in the first example according to the invention.

As shown in FIG. 12, a silicon nitride film ($Si_3N_4$ film) 504 having a thickness about 100 nm is formed on a silicon substrate 505, for example, by a reduced pressure CVD (chemical vapor deposition) method. An oxide film ($SiO_2$ film) 503 having a thickness of about 700 nm as an interlayer insulating film is formed on the silicon nitride film 504 by a normal pressure CVD method. Thereafter, poly-Si 501a is formed on the oxide film 503, and a photoresist film not shown in the figure is accumulated on the poly-Si. The photoresist film is patterned to a diameter of 0.3 μm by an excimer laser stepper, and a hole is opened in the poly-Si 501a by using the patterned photoresist as a mask. After removing the photoresist film, poly-Si 501b having a thickness of 300 nm is formed on the poly-Si 501a, for example, by a reduced pressure CVD method. Accordingly, an etching mask 501 having an opening 501c having a smaller diameter than the opening diameter (0.3 μm) of the poly-Si 501a is formed on the oxide film 503.

Thereafter, as shown in FIG. 13, etching of the oxide film 503 is started with the etching mask 501 as a mask, the etching is stopped before the silicon oxide film 504 as an underlayer of the oxide film 503 is exposed. The etching of this example is conducted by using the plasma etching apparatus of a dipole ring type shown in FIG. 8, and the etching conditions are as follows.
($C_4F_8$ series step)

| Etching gas (gas flow amount): | $C_4F_8$ (15 sccm) |
| --- | --- |
| | CO (150 sccm) |
| | Ar (300 sccm) |
| | $O_2$ (7 Sccm) |
| Pressure: | 4.0 Pa |
| RF power: | 1,500 watt |
| Wafer temperature: | 20° C. |
| Rotation number of dipole ring: | 20 rpm |

As shown in FIG. 14, the etching gas is switched from the $C_4F_8$ series gas to the $CHF_3$ series gas to etch the remaining oxide film 503 and the silicon nitride film 504 as an underlayer. Accordingly, a contact hole 502 is formed in the oxide film 503 and the silicon nitride film 504. The etching conditions at this time are as follows.

($CHF_3$ series step)

| Etching gas (gas flow amount): | $CHF_3$ (30 sccm) |
| --- | --- |
| | CO (170 sccm) |
| | $O_2$ (2 sccm) |
| Pressure: | 4.0 Pa |
| RF power: | 1,500 watt |
| Wafer temperature: | 20° C. |
| Rotation number of dipole ring: | 20 rpm |
| Over-etching amount: | 30% |

As a result of the etching shown in FIG. 14, the etching stop and the delay of etching at the interface between the interlayer insulating film 503 and the silicon nitride film 504 do not occur, which occur in the conventional method. Furthermore, it has been confirmed that the bowing shape due to etching of the side surface of the contact hole 502 is also not formed, and the contact hole 502 can be opened with the perpendicular processing shape. Moreover, the etching maintains a high selectivity with respect to the underlying silicon substrate 505, and the wear of the silicon substrate is minimized.

As a result of the subsequent burying of poly-Si of about 400 nm in the contact hole by a reduced pressure CVD method, followed by etch back, the plug loss described above are completely not formed since the resulting contact hole 502 does not have the bowing shape. Furthermore, a defective, such as increase of the contact resistance and decrease of yield in contact formation, is completely not formed. Therefore, according to the first example described above, a contact hole of good quality can be opened in a continuous manner in an interlayer insulating film comprising a multi-layer film with ensuring the reliability of the contact resistance.

In other words, in the step of opening a minute contact hole in an interlayer insulating film comprising a multi-layer film, the minute contact hole can be processed through continuously etching the oxide film and the silicon nitride film, as the interlayer insulating film, only by switching the gas conditions in one chamber, without conducting an ashing step or a cleaning step during the process, without formation of particles due to removal of a reaction product formed inside the chamber, and without damaging an electrostatic chuck inside the chamber made of polyimide.

The method for etching according to the second example of the invention will be described with reference to FIGS. 12 to 14. The same parts as in the first example are omitted.

The sample shown in FIG. 12 is used, the etching of which is conducted by using the plasma etching apparatus of a TCP type shown in FIG. 9, and the etching conditions are as follows.
($C_4F_8$ series step)

| Etching gas (gas flow amount): | $C_4F_8$ (40 sccm) |
| --- | --- |
| | CO (150 sccm) |
| | Ar (300 sccm) |
| | $O_2$ (0 sccm) |
| Pressure: | 6.0 Pa |
| RF power: | 1,500 watt |
| Wafer temperature: | 20° C. |
| RF bias: | 100 watt |

As shown in FIG. 14, the etching gas is switched from the $C_4F_8$ series gas to the $CHF_3$ series gas to etch the remaining oxide film 503 and the silicon nitride film 504 as an underlayer. The etching conditions at this time are as follows.

(CHF₃ series step)

| Etching gas (gas flow amount): | CHF₃ (30 sccm) |
| --- | --- |
| | CO (170 sccm) |
| | O₂ (2 sccm) |
| Pressure: | 4.0 Pa |
| RF power: | 1,500 watt |
| Wafer temperature: | 20° C. |
| RF bias: | 100 watt |
| Over-etching amount: | 30% |

In the second example described above, the same effect as in the first example can be obtained.

The method for etching according to the third example of the invention will be described with reference to FIGS. 12 to 14. The same parts as in the first example are omitted.

The sample shown in FIG. 12 is used, the etching of which is conducted by using the ECR plasma etching apparatus shown in FIG. 10, and the etching conditions are as follows.

(C₄F₈ series step)

| Etching gas (gas flow amount): | C₄F₈ (10 sccm) |
| --- | --- |
| | CO (150 sccm) |
| | Ar (200 sccm) |
| | O₂ (7 sccm) |
| Pressure: | 4.0 Pa |
| Microwave output power: | 900 watt |
| Wafer temperature: | 20° C. |
| RF bias: | 100 watt |

As shown in FIG. 14, the etching gas is switched from the C₄F₈ series gas to the CHF₃ series gas to etch the remaining oxide film 503 and the silicon nitride film 504 as an underlayer. The etching conditions at this time are as follows.

(CHF₃ series step)

| Etching gas (gas flow amount): | CHF₃ (20 sccm) |
| --- | --- |
| | CO (160 sccm) |
| | O₂ (2 sccm) |
| Pressure: | 3.0 Pa |
| TCP antenna RF power: | 1,800 watt |
| Wafer temperature: | 20° C. |
| RF bias: | 100 watt |
| Over-etching amount: | 50% |

In the third example described above, the same effect as in the first example can be obtained.

The method for etching according to the fourth example of the invention will be described with reference to FIGS. 12 to 14. The same parts as in the first example are omitted.

The sample shown in FIG. 12 is used, the etching of which is conducted by using the plasma etching apparatus of an ICP type shown in FIG. 11, and the etching conditions areas follows.

(C₄F₈ series step)

| Etching gas (gas flow amount): | C₄F₈ (20 sccm) |
| --- | --- |
| | CO (150 sccm) |
| | Ar (300 Sccm) |
| | O₂ (2 sccm) |
| Pressure: | 5.0 Pa |
| ICP output power: | 900 watt |
| Wafer temperature: | 20° C. |
| RF bias: | 150 watt |

As shown in FIG. 14, the etching gas is switched from the C₄F₈ series gas to the CHF₃ series gas to etch the remaining oxide film 503 and the silicon nitride film 504 as an underlayer. The etching conditions at this time are as follows.

(CHF₃ series step)

| Etching gas (gas flow amount): | CHF₃ (30 sccm) |
| --- | --- |
| | CO (170 sccm) |
| | O₂ (2 sccm) |
| Pressure: | 4.0 Pa |
| TCP antenna RF power: | 1,500 watt |
| Wafer temperature: | 20° C. |
| RF bias: | 100 watt |
| Over-etching amount: | 30% |

In the second example described above, the same effect as in the first example can be obtained.

While the invention has been described with reference to the four examples, the invention is not construed as being limited to them, and the process conditions, such as the plasma source, the apparatus constitution, the sample constitution and the etching gas, can be appropriately selected without departing from the spirit and scope of the invention.

The invention can be applied to the etching of the interlayer film in the formation of a contact hole between a word line and a bit line in a DRAM. That is, an SiN layer may be formed under a capacitor to obtain voltage resistance between the contact hole and the bit and word lines. Therefore, in order to open the contact hole, a multi-layer film obtained by laminating an oxide layer and the SiN layer must be etched. The invention is preferably applied to the case where the multi-layer film is etched at the same time.

According to the invention described above, a method for etching that can form a contact hole in an interlayer film obtained by laminating an upper layer and a lower layer even though a removing step of a reaction product and a cleaning step are omitted. In particular, it can provide a method for etching that can form a contact hole in an interlayer film obtained by laminating an oxide film and a silicon nitride film even though a removing step of a reaction product and a cleaning step are omitted.

What is claimed is:

1. A process for producing a semiconductor device comprising etching a laminated film comprising a silicon nitride film having an oxide film formed thereon, said process comprising:

a step, in which etching of said oxide film is started with a C₄F₈ series gas, and said etching with said C₄F₈ series gas is stopped before said silicon nitride film is exposed; and a step, in which a remainder of said oxide film and said silicon nitride film is etched with switching an etching gas from the C₄F₈ series gas to a CHF₃ series gas.

* * * * *